US008867290B2

(12) United States Patent
Yamada

(10) Patent No.: US 8,867,290 B2
(45) Date of Patent: Oct. 21, 2014

(54) APPARATUSES, INTEGRATED CIRCUITS, AND METHODS FOR MEASURING LEAKAGE CURRENT

(71) Applicant: Micron Technology, Inc., Boise, ID (US)

(72) Inventor: Shigekazu Yamada, Tokyo (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/160,158

(22) Filed: Jan. 21, 2014

(65) Prior Publication Data
US 2014/0133249 A1    May 15, 2014

Related U.S. Application Data

(63) Continuation of application No. 13/282,308, filed on Oct. 26, 2011, now Pat. No. 8,634,264.

(51) Int. Cl.
| G11C 29/00 | (2006.01) |
| G11C 7/06 | (2006.01) |
| G11C 7/02 | (2006.01) |
| G11C 8/00 | (2006.01) |
| G11C 29/02 | (2006.01) |
| G11C 8/08 | (2006.01) |
| G11C 29/12 | (2006.01) |
| G11C 29/50 | (2006.01) |

(52) U.S. Cl.
CPC ...... *G11C 29/025* (2013.01); *G11C 2029/1202* (2013.01); *G11C 2029/5006* (2013.01); *G11C 8/08* (2013.01)

USPC .. 365/201; 365/189.07; 365/206; 365/230.06

(58) Field of Classification Search
USPC ......................................................... 365/201
See application file for complete search history.

(56) References Cited

U.S. PATENT DOCUMENTS

| 5,117,426 | A | 5/1992 | Mcadams |
| 5,258,958 | A | 11/1993 | Iwahashi et al. |
| 5,428,621 | A * | 6/1995 | Mehrotra et al. ............. 714/721 |
| 5,587,948 | A | 12/1996 | Nakai |
| 5,600,594 | A | 2/1997 | Padoan et al. |
| 5,615,154 | A | 3/1997 | Yamada |
| 5,956,277 | A | 9/1999 | Roohparvar |
| 5,966,330 | A | 10/1999 | Tang et al. |
| 6,205,057 | B1 | 3/2001 | Pan |
| 6,226,200 | B1 | 5/2001 | Eguchi et al. |
| 6,242,936 | B1 | 6/2001 | Ho et al. |
| 6,285,598 | B1 | 9/2001 | Khan et al. |
| 6,324,094 | B1 | 11/2001 | Chevallier |
| 6,496,415 | B2 | 12/2002 | Tsao |
| 6,501,674 | B2 | 12/2002 | Ashikaga |
| 6,542,409 | B2 | 4/2003 | Yamada |
| 6,580,644 | B1 | 6/2003 | Chung |
| 6,639,833 | B2 | 10/2003 | Campardo et al. |

(Continued)

*Primary Examiner* — Son Mai
(74) *Attorney, Agent, or Firm* — Dorsey & Whitney LLP

(57) ABSTRACT

Methods, apparatuses, and integrated circuits for measuring leakage current are disclosed. In one such example method, a word line is charged to a first voltage, and a measurement node is charged to a second voltage, the second voltage being less than the first voltage. The measurement node is proportionally coupled to the word line. A voltage on the measurement node is compared with a reference voltage. A signal is generated, the signal being indicative of the comparison. Whether a leakage current of the word line is acceptable or not can be determined based on the signal.

20 Claims, 8 Drawing Sheets

(56) References Cited

U.S. PATENT DOCUMENTS

| | | |
|---|---|---|
| 6,639,849 B2 | 10/2003 | Takahashi et al. |
| 6,714,453 B2 | 3/2004 | Cavaleri et al. |
| 6,781,884 B2 | 8/2004 | Yamada |
| 6,819,612 B1 | 11/2004 | Achter |
| 6,826,066 B2 | 11/2004 | Kozaru |
| 6,839,279 B2 | 1/2005 | Yamada |
| 6,912,160 B2 | 6/2005 | Yamada |
| 6,975,542 B2 | 12/2005 | Roohparvar |
| 7,031,210 B2 | 4/2006 | Park et al. |
| 7,038,482 B1 | 5/2006 | Bi |
| 7,180,781 B2 | 2/2007 | Abedifard et al. |
| 7,317,658 B2 | 1/2008 | Takazawa et al. |
| 7,336,545 B2 | 2/2008 | Tanzawa |
| 7,397,708 B2 | 7/2008 | Oh |
| 7,483,305 B2 | 1/2009 | Yamada |
| 7,505,334 B1 | 3/2009 | Breitwisch et al. |
| 7,619,924 B2 | 11/2009 | Bollu et al. |
| 7,672,158 B2 | 3/2010 | Nakamura et al. |
| 7,835,178 B2 | 11/2010 | Chen et al. |
| 7,898,897 B2 | 3/2011 | Choi |
| 7,965,577 B2 | 6/2011 | Chen et al. |
| 8,514,630 B2 * | 8/2013 | Huynh et al. ............ 365/185.21 |
| 2002/0071314 A1 | 6/2002 | Sakakibara et al. |
| 2002/0118574 A1 | 8/2002 | Gongwer et al. |
| 2002/0149965 A1 | 10/2002 | Campardo et al. |
| 2003/0151945 A1 | 8/2003 | Tanzawa |
| 2005/0105333 A1 | 5/2005 | Park et al. |
| 2006/0007733 A1 | 1/2006 | Tanzawa |
| 2006/0083070 A1 | 4/2006 | Arakawa |
| 2007/0216467 A1 | 9/2007 | Akiyama et al. |
| 2009/0116290 A1 | 5/2009 | Yamada |
| 2010/0125429 A1 | 5/2010 | Yamada |
| 2010/0238729 A1 | 9/2010 | Lee et al. |
| 2010/0329026 A1 | 12/2010 | Nakamura et al. |
| 2012/0008384 A1 | 1/2012 | Li et al. |
| 2012/0218833 A1 | 8/2012 | Yamada |
| 2012/0230107 A1 | 9/2012 | Ogura et al. |
| 2012/0281479 A1 | 11/2012 | Kochar et al. |
| 2013/0107640 A1 | 5/2013 | Yamada |

* cited by examiner

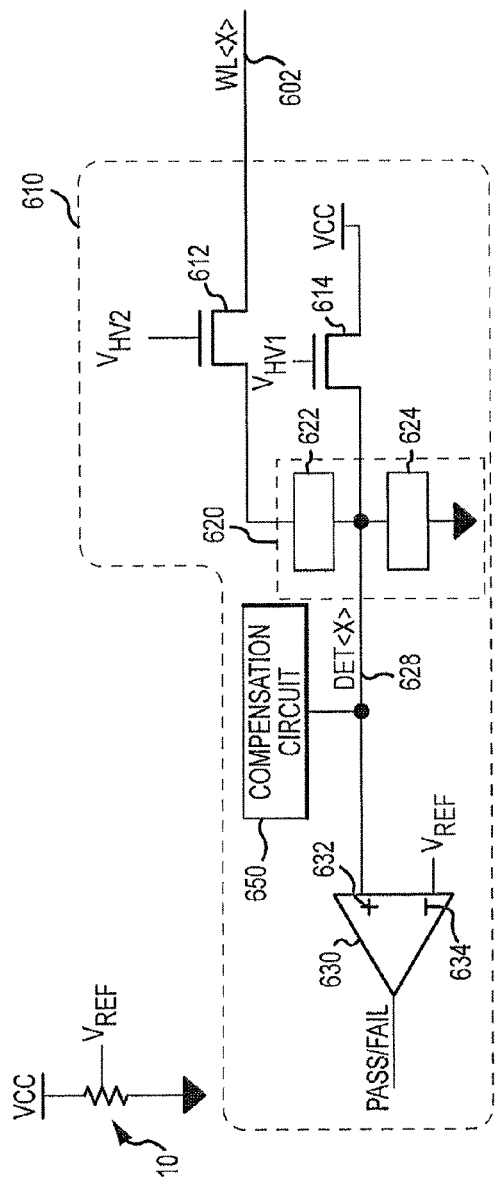
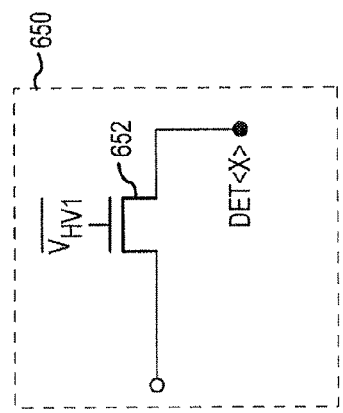
FIGURE 6A
FIGURE 6B

APPARATUSES, INTEGRATED CIRCUITS, AND METHODS FOR MEASURING LEAKAGE CURRENT

CROSS-REFERENCE TO RELATED APPLICATION

This application is a continuation of U.S. patent application Ser. No. 13/282,308, filed Oct. 26, 2011, U.S. Pat. No. 8,634,264 issued on Jan. 21, 2014. This application and patent are incorporated by reference herein in their entirety and for all purposes.

TECHNICAL FIELD

Embodiments of the invention relate generally to integrated circuits, and more particularly, in one or more of the illustrated embodiments, to measuring leakage current in integrated circuits.

BACKGROUND OF THE INVENTION

With the increasing popularity of electronic devices, such as laptop computers, portable digital assistants, digital cameras, mobile phones, digital audio players, video game consoles and the like, nonvolatile memory usage has continued to increase. Nonvolatile memories come in various types, including flash memories. Flash memories are widely used for information storage in electronic devices such as those mentioned above and others.

In conventional flash memories, data is stored in an array of individual memory cells, each of which includes a charge storage structure, such as a charge trap or floating gate. Generally speaking, with floating gate cells, each of the memory cells has two gates. One gate, the control gate, is analogous to the gate in a MOSFET. The other gate, the floating gate, is insulated all around by an oxide layer and is coupled between the control gate and the substrate. Because the floating gate is insulated by an oxide layer, any electrons placed on it (e.g., by tunneling) get trapped there and thereby enable the storage of data. More specifically, when electrons are stored on the floating gate, their presence modifies, by partially canceling out, the electric field generated when a voltage is provided to the control gate. This results in the modification of the threshold voltage of the channel of the cell, since a higher voltage on the control gate is needed to enable an electrical current to flow between the source and the drain of the cell as compared with what would be needed if there were no electrons stored on the floating gate. If the number of electrons stored on the floating gate is sufficiently large, the resulting modified threshold voltage will inhibit electrical current from flowing between the source and the drain when the normal operating voltage is provided to the control gate. Hence, in a typical flash memory cell that stores a single bit of data, electrical current will either flow or not flow when a memory cell is being read by providing a voltage on the control gate, depending on the number of electrons on the floating gate. The flow or no flow of electrical current, in turn, translates to a stored bit of data having a value of 1 or 0, respectively. Some flash memories (or other non-volatile storage devices) include multi-level cells, where a single cell is configured to store multiple bits of data by programming the memory cell to one of more than two data states (e.g., where each of the data states corresponds to respective ranges of threshold voltages).

In the pursuit of greater storage capacity in ever smaller chips, flash memory density has been increasing over the years, in part due to the down scaling of the memory cell dimensions. The continued down scaling of electronic devices has created many challenges and opportunities, among them the quest for an ultra-thin gate oxide. One problem that sometimes results from a thin gate oxide is leakage current. For example, when the oxide layer surrounding the floating gate of a flash memory cell is very thin, electrons stored on the floating gate may leak out (e.g., from the floating gate to the control gate and the word line that is coupled to the control gate, and eventually to ground), thus changing the originally stored bit of data having a value of 0, for example, into a bit of data having a value of 1.

The continued down scaling of electronic devices also tends to decrease the physical separation of components on an integrated circuit chip. For example, in a memory device, the tight word line to word line pitch may increase the possibility of leakage current from one word line to another. This may particularly be true in flash-type memories where one word line is charged to a high voltage (e.g., 10V) while the neighboring word lines and other components remain at a lower voltage (e.g., 0V, 2.3V, 5V, etc.). The high voltage may be generated in a voltage source (e.g., a charge pump or a voltage shifter) circuit and may be provided to a word line in a flash memory array to, for example, program one or more memory cells coupled to the word line. The world line charged to a high voltage may therefore induce leakage current to adjacent word lines and/or to other nearby components of the flash memory device. Although some leakage current can be tolerated in some cases, leakage current above a certain threshold may improperly alter the operation of some devices. If, for example, a particular word line in a flash memory array has a leakage path to a neighboring word line, the leaked current may alter the data stored in the floating gates of the neighboring word line. As another example, excessive leakage current may increase the power consumed (and thus the heat generated) by an integrated circuit chip.

In order to identify unacceptable leakage current levels (including the types of leakage current mentioned briefly above, and others), some integrated circuit chips may be tested during manufacturing. In a flash memory device, for example, a leakage current test may be conducted to measure the leakage current on each of the word lines to determine whether the leakage current from each word line is above a certain threshold and thus unacceptable.

BRIEF DESCRIPTION OF THE DRAWINGS

FIG. 6A is a schematic diagram of a word line leakage circuit according to an embodiment of the invention.

FIG. 6B is a schematic diagram of a compensation circuit according to an embodiment of the invention.

DETAILED DESCRIPTION

Certain details are set forth below to provide a sufficient understanding of embodiments of the invention. However, it will be clear to one skilled in the art that embodiments of the invention may be practiced without these particular details. Moreover, the particular embodiments of the present invention described herein are provided by way of example and should not be used to limit the scope of the invention to these particular embodiments. In other instances, well-known circuits, control signals, timing protocols, and software operations have not been shown in detail in order to avoid unnecessarily obscuring the invention.

Figure 1:
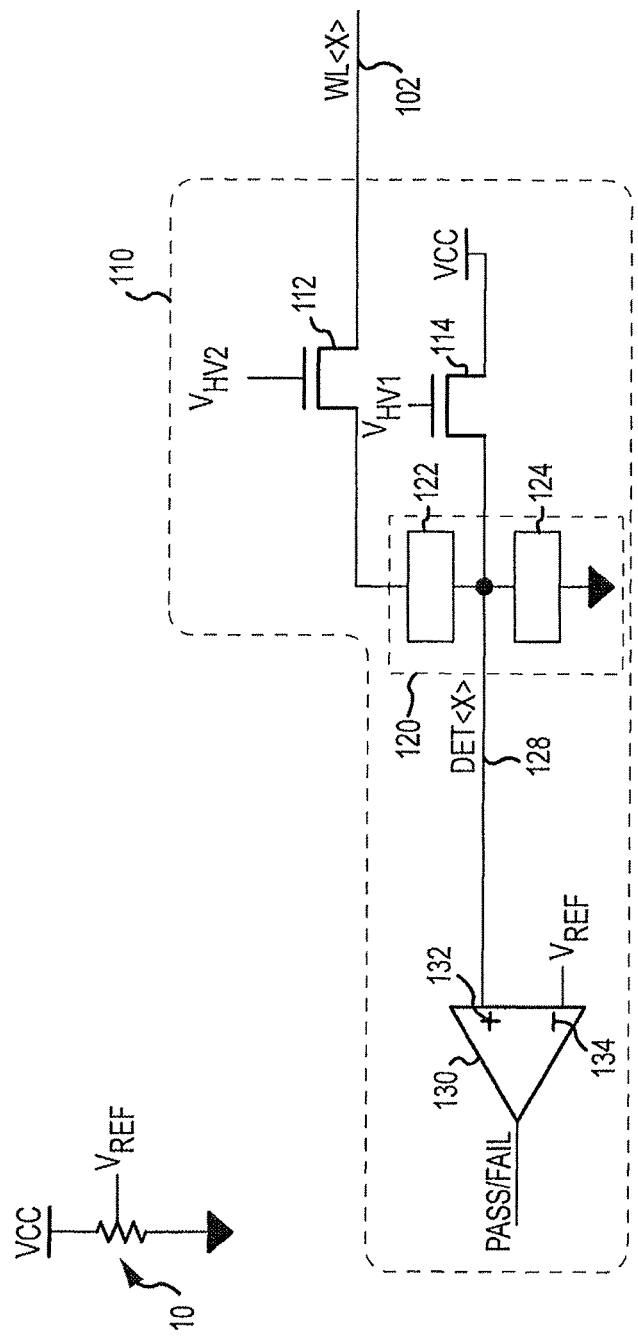
FIG. 1 is a schematic diagram of a word line leakage circuit according to an embodiment of the present invention.

FIG. 1 illustrates an apparatus including a word line leakage circuit 110 according to an embodiment of the invention. The apparatus may include several word line leakage circuits 110, and in some embodiments may include a word line leakage circuit for each word line. The word line leakage circuits 110 in the apparatus may be configured to test for word line leakage current during, for example, a manufacturing verification process. Each word line leakage circuit 110 may be coupled to a respective word line WL<X> 102 through a switch 112 in the word line leakage circuit. The switch 112 coupling each word line WL<X> 102 to its respective word line leakage circuit 110 may in some embodiments be an n-channel field effect transistor (nFET), and may receive a control signal $V_{HV2}$ at a control node that enables or disables the switch. In other embodiments, the switch 112 may be a p-channel field effect transistor (pFET), a transmission gate, or a switching element. The control signal $V_{HV2}$ may be an active high voltage signal and may be generated, for example, in a voltage source. When the $V_{HV2}$ signal is active (at, e.g., 15V for the embodiment illustrated in FIG. 1), it may be some threshold above the maximum voltage that word line WL<X> 102 is charged to during a programming operation (e.g., 10V).

Each word line WL<X> 102 may be coupled to a proportioning circuit 120 of the word line leakage circuit 110 through the switch 112. The proportioning circuit 120 may in some embodiments include two capacitances 122, 124. The first capacitance 122 may couple the word line WL<X> to a measurement node DET<X>, while the second capacitance 124 may couple the measurement node DET<X> to a reference voltage node, such as ground. The proportioning circuit may act as a capacitive voltage divider, proportioning the voltage on the measurement node DET<X> to the voltage on the word line WL<X>.

The size and type of capacitances in the proportioning circuit 120 may in some embodiments be designed to keep an inverted state during operation. The capacitances 122, 124 may also be designed in some embodiments so that the voltage on the measurement node is approximately equal to or less than a supply voltage, such as VCC (e.g., 2.3V), in order to avoid needing to use high voltage transistors in the comparator 130, which is described in more detail below. The capacitances 122, 124 may also in some embodiments reduce leakage from the measurement node DET<X> during a leakage measurement test. One or both of the capacitances 122, 124 may in some embodiments be an nFET or pFET with the source, gate, and drain nodes coupled to one another and forming a first node of the capacitance, with the gate node forming the second node of the capacitance. In other embodiments, other forms of capacitances may be used. Furthermore, the measurement node DET<X> 128 may in some embodiments be shielded, such as by positioning lines associated with the measurement node DET<X> 228 between lines coupled to a reference voltage, such as ground.

The measurement node DET<X> 128 of each word line leakage circuit 110 may further be coupled to a supply voltage source (with the supply voltage being VCC, which may be, e.g., 2.3V) through a switch 114. The switch 114 may in some embodiments be an nFET, and may receive a control signal $V_{HV1}$ at a control node that enables or disables the switch. The control signal $V_{HV1}$ may be an active high voltage signal generated in a voltage source and may, when active (at, e.g., 5V for the embodiment illustrated in FIG. 1), be some threshold above a supply voltage, such as VCC (with VCC being, e.g., 2.3V). The measurement node DET<X> 128 of each word line leakage circuit 110 may further be coupled to a positive input node 132 of a comparator 130, such as a differential amplifier.

Also shown in FIG. 1 is a reference voltage generator 10. The reference voltage generator 10 may comprise a voltage divider that generates a reference voltage $V_{REF}$ (e.g., 2.2V) that is some fraction of a supply voltage, such as VCC (e.g., 2.3V). The reference voltage generator 10 may be constructed from, among other things, two resistances coupled in series between a supply voltage source and a reference voltage node, such as ground, with the reference voltage $V_{REF}$ being measured in between the two serially-coupled resistances. In other embodiments, however, the reference voltage generator may be constructed from capacitances. Generally, the voltage reference may be generated in any manner. In some embodiments, the reference voltage generator is configurable to provide more than one reference voltage, for example in response to an external signal. The reference voltage $V_{REF}$ generated in the reference voltage generator may be provided to the negative input node 134 of the comparator 130 in the word line leakage circuit 110.

The comparator 130 of the word line leakage circuit 110 illustrated in FIG. 1 compares the voltage of the measurement node DET<X> 128 with the reference voltage $V_{REF}$ and generates an output signal indicative of the comparison. The output of the comparator 130 may be a pass/fail signal indicating whether a word line's leakage current is acceptable or unacceptable during a leakage test of the word line, as explained in more detail below.

In operation, a word line WL<X> 102 to be tested is charged to a high voltage (e.g., 10V) by a high voltage source (not shown) and the switch 112 is made conductive. The high voltage source may in some embodiments be the same circuitry that is used to program the word line WL<X> in response to a program command during normal operation (e.g., a programming voltage source), and the high voltage may be the programming voltage to which the word line is charged in response to the program command. In these embodiments, charging the word line WL<X> 102 to the same high voltage as it is charged to during normal operations using the same voltage source may model the high voltage biasing of the word line during normal operation. In FIG. 1, the switch 112, illustrated as an nFET, is made conductive by providing an active $V_{HV2}$ signal (at, e.g., 15V) at the switch's control node. The switch 114 is also made conductive in order to charge the respective measurement node DET<X> to a supply voltage such as VCC (e.g., 2.3V) through, for example a supply voltage source. In FIG. 1, the switch 114, also illustrated as an nFET, is made conductive by providing an active $V_{HV1}$ signal (at, e.g., 5V) at the switch's control node. Once the word line WL<X> to be tested is charged to the high voltage and the respective measurement node DET<X> is charged to the supply voltage, the word line is disconnected from the high voltage source and the measurement node is disconnected from the supply voltage source, and both the word line WL<X> and the measurement node DET<X> are allowed to float. For example, the high voltage source (not shown in FIG. 1) charging the word line WL<X> may be decoupled from the word line, and the switch 114 may be made non-conductive in order to decouple the measurement node DET<X> from the supply voltage source, such as VCC.

When the word line WL<X> 102 is charged to a high voltage (e.g., 10V) and allowed to float, leakage current(s) may exist from word line WL<X> to other word lines (e.g., WL<X−1> and/or WL<X+1>) or elsewhere, such as an nwell. As current leaks from the world line WL<X> 102 being tested, the voltage on the word line will decrease in proportion to the leakage current because the word line is not coupled to a voltage source to replenish the charge that leaks away from the word line. The voltage on the measurement node DET<X> 128 will decrease in proportion to the voltage on the word line WL<X> 102 because of the proportioning circuit 120, illustrated as a capacitive voltage divider in FIG. 1. Accordingly, the voltage provided to the positive input node 132 of the comparator 130 will decrease in proportion to the amount of current that leaks from the word line WL<X> to other word lines or elsewhere.

If the voltage provided to the positive input node 132 falls below the reference voltage provided to the negative input node 134, the comparator 130 will output a signal indicating that the voltage on the measurement node DET<X> is less than the reference voltage $V_{REF}$. If the voltage provided to the positive input node 132 is not less than the reference voltage provided to the negative input node 134, the comparator 130 will output a signal indicating that the voltage on the measurement node DET<X> is not less than the reference voltage $V_{REF}$. The output signal from the comparator 130 may be monitored during a leakage current test for a particular (e.g., predetermined) length of time. If the output signal indicates that the voltage on the measurement node DET<X> is less than the reference voltage $V_{REF}$ after the particular length of time, the word line WL<X> 102 leakage current is too great and the word line WL<X> fails the test. If the output signal indicates that the voltage on the measurement node DET<X> is not less than the reference voltage $V_{REF}$ after the particular length of time, the word line WL<X> 102 leakage current is acceptable and the word line WL<X> passes the test. The timing of the input signals and the output signals during a particular leakage test is described below in more detail in connection with FIGS. 2 through 5B.

Figure 2:
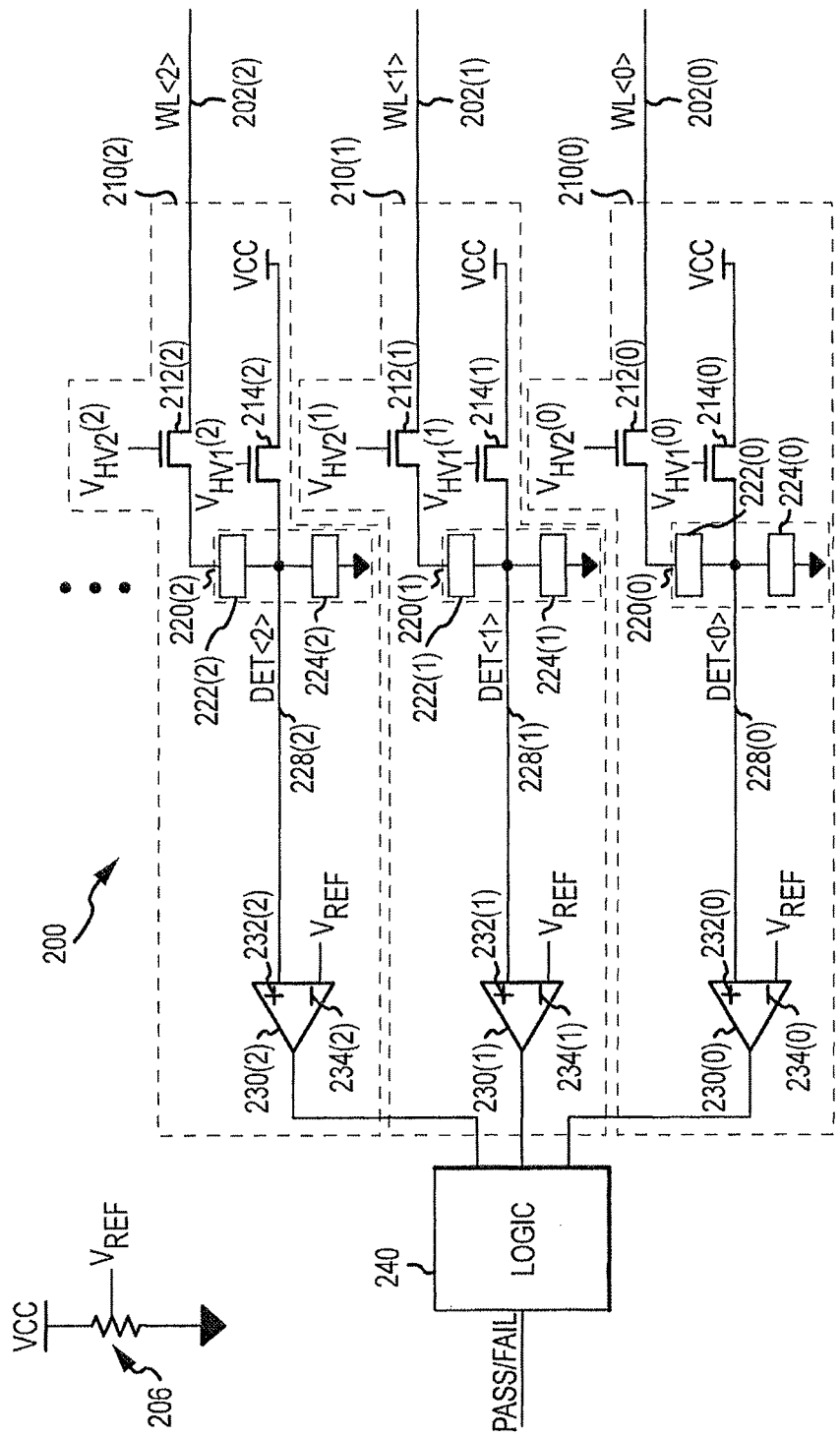
FIG. 2 is a schematic diagram of a word line leakage measurement system according to an embodiment of the invention.

FIG. 2 illustrates an apparatus that includes a word line leakage measurement system 200 with three word lines WL<0> 202(0), WL<1> 202(1), WL<2> 202(2) in a device, although any number of word lines may be used. Each word line WL<0> 202(0), WL<1> 202(1), WL<2> 202(2) has a respective word line leakage circuit 210(0), 210(1), 210(2), as described above. As illustrated in FIG. 2, a single reference voltage generator 206 may provide a reference voltage $V_{REF}$ to all of the comparators 230(0), 230(1), 230(2). In other embodiments, a plurality of reference voltage generators may provide one or more local comparators with a reference voltage. The word line leakage measurement system 200 illustrated in FIG. 2 also includes logic 240. Logic 240 may be used to combine the output of one or more comparators 230(0), 230(1), 230(2) and generate a pass/fail signal or signals indicative of whether the device as a whole or the individual word lines have an acceptable or unacceptable amount of leakage current. In some embodiments, logic 240 may be one or more AND gates, a multiplexer, and so forth. Furthermore, some embodiments may not have logic 240, but rather may provide each of the plurality of comparator output signals to a leakage measurement system controller (not shown).

Figure 3:
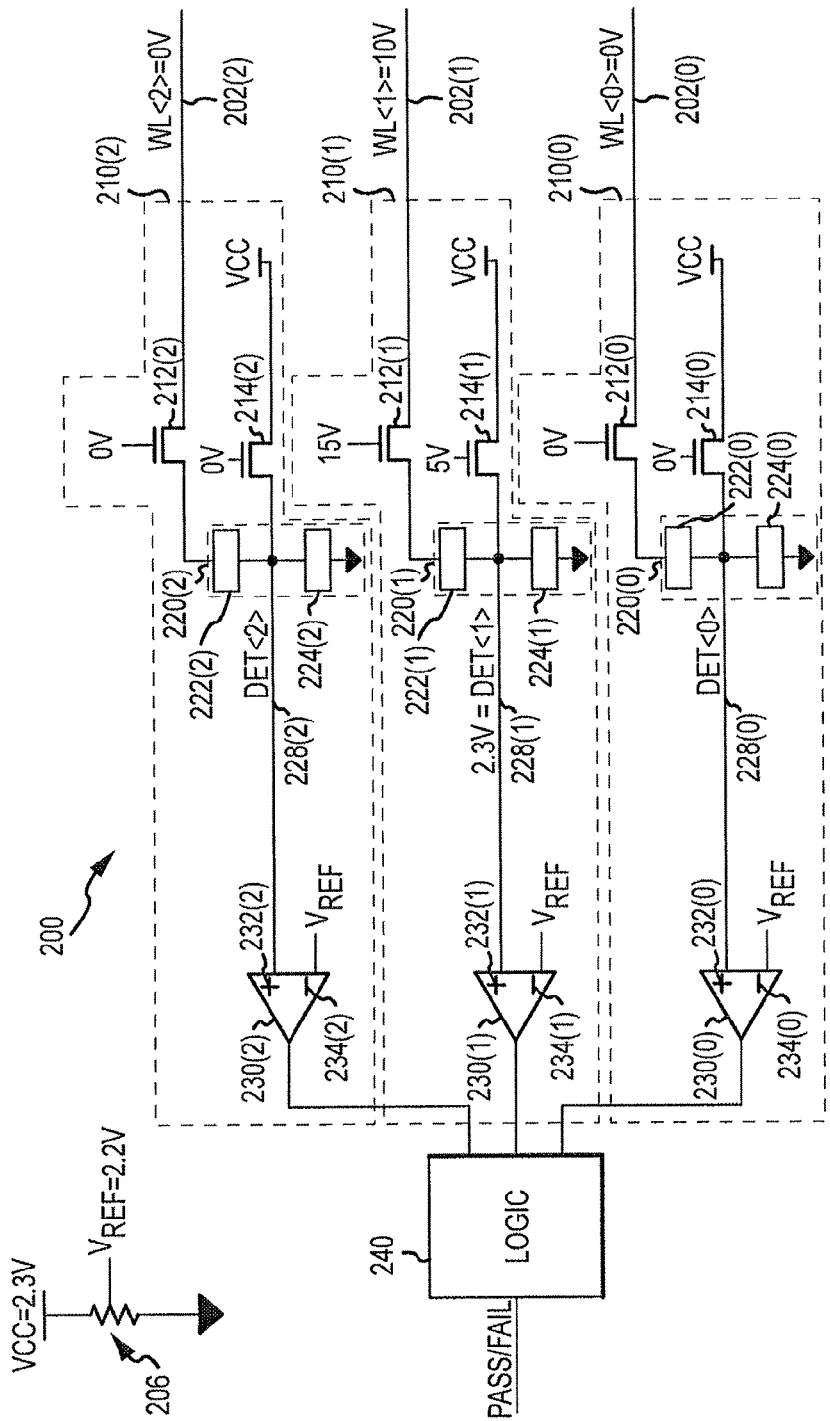
FIG. 3 is a schematic diagram illustrating the operation of a word line leakage measurement system according to an embodiment of the invention.
Figure 4:
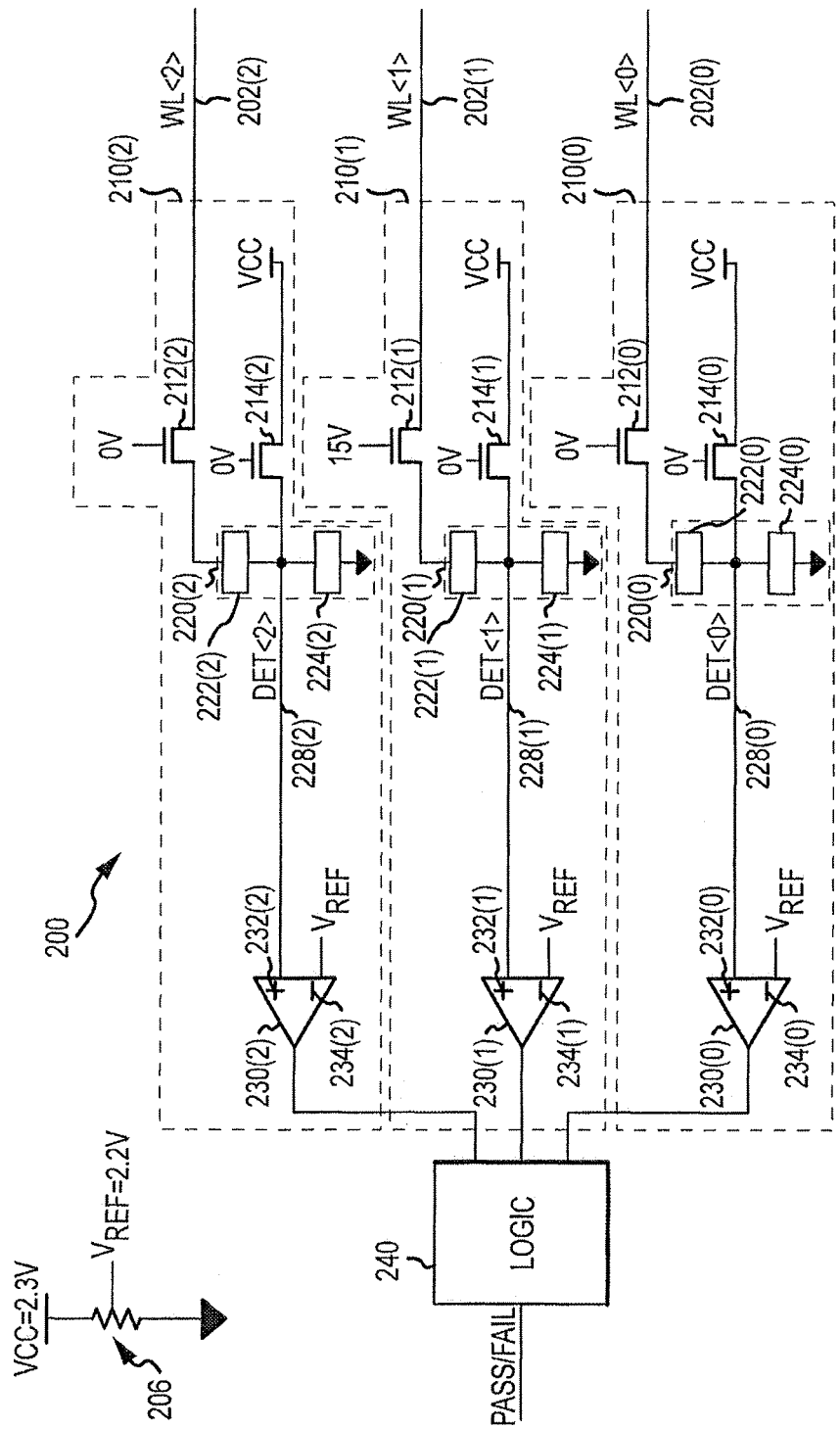
FIG. 4 is a schematic diagram illustrating the operation of a word line leakage measurement system according to an embodiment of the invention.

FIGS. 3 and 4 illustrate one example of operation of the word line leakage measurement system 200. In FIG. 3, the word line leakage measurement system 200 is initialized to test for leakage current on word line WL<1> 202(1). Word line WL<1> 202(1) is charged to 10V by a high voltage source (not shown), while word lines WL<0> 202(0) and WL<2> 202(2) are charged to 0V. Switch 212(1), illustrated as an nFET, is made conductive by providing 15V to the control node of the switch in order to couple the word line WL<1> 202(1) to the word line leakage circuit 210(1). Switch 214(1), also illustrated as an nFET, is made conductive by providing 5V to the control node of the switch in order to charge the measurement node DET<1> 228(1) to a supply voltage, such as VCC, which is 2.3V in the circuit illustrated in FIG. 3.

Following the initialization illustrated in FIG. 3, all of the word lines WL<2> 202(2), WL<1> 202(1), WL<0> 202(0) are decoupled from voltage sources and allowed to float, as illustrated in FIG. 4. Also, the measurement node DET<1> 228(1) is decoupled from the supply voltage source by making switch 214(1) non-conductive (by providing 0V to the control node of the switch), thus allowing the measurement node DET<1> to float. Switch 212(1) remains conductive in order to continue coupling the word line WL<1> 202(1) to the measurement node DET<1> 228(1) via the proportioning circuit 220(1). After the word line WL<1> 202(1) and the measurement node DET<1> 228(1) are charged and then decoupled from the high voltage source and supply voltage source, respectively, and allowed to float, some leakage current, if any, may leak from word line WL<1>, for example, to the neighboring word lines WL<2> 202(2) and/or WL<0> 202(0), or to other areas. If word line WL<1> 202(1) has some leakage current, the voltage on the word line WL<1> as well as the corresponding voltage on the measurement node DET<1> 228(1) may begin to decrease. The voltage on the measurement node DET<1> 228(1) may be compared with the reference voltage $V_{REF}$ in a comparator 230(1), which may output a signal indicating whether the word line WL<1> 202(1) passed or failed the word line leakage current test.

Although FIGS. 3 and 4 have illustrated testing one word line, WL<1> 202(1), for leakage current in a particular failure model (i.e., WL<X+1>=0V, WL<X>=10V, WL<X−1>=0V), many other leakage current tests are possible using the word line leakage measurement system 200. For example, multiple word lines may be tested simultaneously, and/or one or more word lines may be tested in different failure models than that described above. For example, even word lines could be charged to 10V, while odd word lines are charged to 0V. As another example even word lines could be charged to 10V, odd word lines are charged to 5V. Many different leakage tests are possible using the word line leakage measurement system 200 illustrated in FIGS. 3 and 4, including simultaneous, overlapping, and sequential leakage measurement on multiple or individual word lines.

Figure 5A:
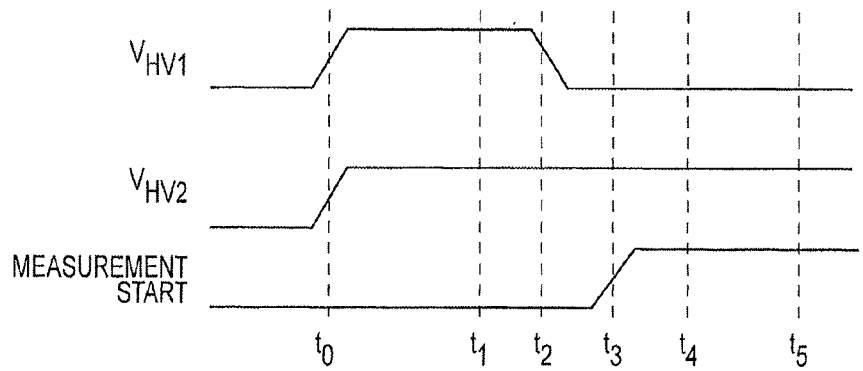
FIG. 5A is a timing diagram illustrating the operation of a word line leakage measurement system according to an embodiment of the invention.
Figure 5B:
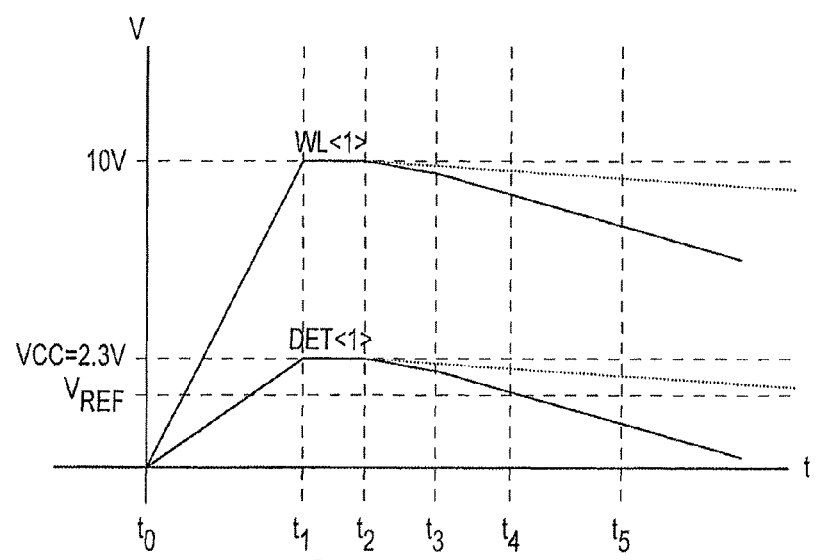
FIG. 5B is a timing diagram illustrating the operation of a word line leakage measurement system according to an embodiment of the invention.

FIGS. 5A and 5B illustrate the timing and voltages of the operation of the word line leakage measurement system 200 illustrated in FIGS. 2 through 4. As in FIGS. 3 and 4, measurement of leakage current from word line WL<1> 202(1) in the failure model described above is used as an example.

Other word lines (WL<2> 202(2), WL<0> 202(0), etc.) may similarly be tested using the word line leakage measurement system 200.

FIG. 5A illustrates the timing of several signals over a period of time and FIG. 5B illustrates the corresponding voltage on the word line WL<1> 202(1) and the measurement node DET<1> 228(1) over the same period of time. At a first time, $t_0$, the measurement start signal is low and the $V_{HV1}$ signal transitions from a logical low (e.g., 0V) to a logical high (e.g., 5V) in order to charge the measurement node DET<1> 228 to a supply voltage, such as VCC (e.g., 2.3V) by a supply voltage source. At time $t_0$, the $V_{HV2}$ signal also transitions from a logical low (e.g., 0V) to a logical high (e.g., 15V) in order to couple the word line WL<1> 202(1) to the proportioning circuit 220(1). At or before time $t_0$, the word line WL<1> 202(1) begins charging to a high voltage (e.g., 10V) by a high voltage source. At time $t_1$, the word line WL<1> 202(1) and the measurement node DET<1> 228 are fully charged. As illustrated in FIG. 5B, the word line WL<1> 202(1) voltage transitions to a high voltage (e.g., 10V) between time $t_0$ and time $t_1$, and the measurement node DET<1> 228 voltage transitions to a supply voltage, such as VCC (e.g., 2.3V) during the same time.

At time $t_2$, the $V_{HV1}$ signal transitions from a logical high to a logical low, thus making switch 214(1) nonconductive in order to decouple the measurement node DET<1> 228(1) from the supply voltage source, such as VCC. Also at time $t_2$, the word line WL<1> 202(1) is decoupled from the high voltage source that charged the word line to a high voltage. Thus both the word line WL<1> and the measurement node DET<1> 228(1) are left floating beginning at time $t_2$. At time $t_3$, which in some embodiments may be, for example, 1 μs after time $t_2$, the measurement start signal transitions from a logical low to a logical high, thus signaling that a word line leakage measurement test is beginning.

At time $t_4$ in the example illustrated in FIG. 5B with a solid line, the voltage on the measurement node DET<1> 228(1) decreases below $V_{REF}$. At time $t_5$, which may be a time after time $t_4$, a determination is made as to whether the word line leakage test failed or passed. In the example illustrated with a solid line in FIG. 5B, the word line WL<1> 202(1) failed the leakage test because the voltage on the measurement node DET<1> 228(1) decreased below $V_{REF}$ before time $t_5$. In the example illustrated in FIG. 5B with a dotted line, the voltage on the measurement node DET<1> 228(1) does not decrease below $V_{REF}$ before or at time $t_5$, and thus the dotted line represents a word line that passed the leakage test. As can be seen in FIG. 5B, the voltage on the measurement node DET<1> 228(1) is generally proportional to the voltage on the word line WL<1> 202(1). This is due to the proportioning circuit 220(1), illustrated as a capacitive voltage divider in FIGS. 2 through 4.

FIG. 6A illustrates an apparatus that includes a word line leakage circuit 610 according to an embodiment of the invention. Also shown in FIG. 6A is a reference voltage generator 10, which generates a reference voltage $V_{REF}$. The word line leakage measurement circuit 610 illustrated in FIG. 6A may be similar in structure and operation to the word line leakage circuit 110 illustrated in FIG. 1, and the word line leakage measurement system 200 illustrated in FIGS. 2 through 4, except that the word line leakage circuit 610 illustrated in FIG. 6A additionally includes a compensation circuit 650.

The compensation circuit 650 of the word line leakage circuit 610 in FIG. 6A may compensate for noise on measurement node DET<X> 628. For example, the transitioning of switch 614 from being conductive to being non-conductive during a leakage current test (similar to the transitioning of switches 114 and 214 from being conductive to being non-conductive, as described above), may introduce some switching noise to the measurement node DET<X> 628, which may in some cases alter the voltage on the measurement node. For example, if the measurement node DET<X> 628 is charged to a supply voltage of 2.3V (as in FIGS. 3 and 4), the transitioning of switch 614 may reduce the voltage on the measurement node from 2.3V to 2.2V. This decreased voltage may lead to improper results during a leakage current test, particularly if, as above, the reference voltage is 2.2V. Accordingly, compensation circuit 650 may compensate for noise on the measurement node DET<X> 228 (e.g., by counteracting the effect of the noise).

FIG. 6B illustrates an embodiment of a compensation circuit 650 configured to compensate for switching noise encountered on the DET<X> line during a conductive-to-non-conductive transition of a switch as described above. In the compensation circuit 650 in FIG. 6B, a switch 652 receives the complement of the $V_{HV1}$ signal at its control node. As a result, as switch 614 transitions from conductive to non-conductive, switch 652 transitions from non-conductive to conductive. In this manner, the switch 652 may compensate for noise introduced by the transition of switch 614. Although FIG. 6B illustrates an embodiment of a compensation circuit 650, other embodiments of a compensation circuit may also be used in the word line leakage circuit 610.

Figure 7:
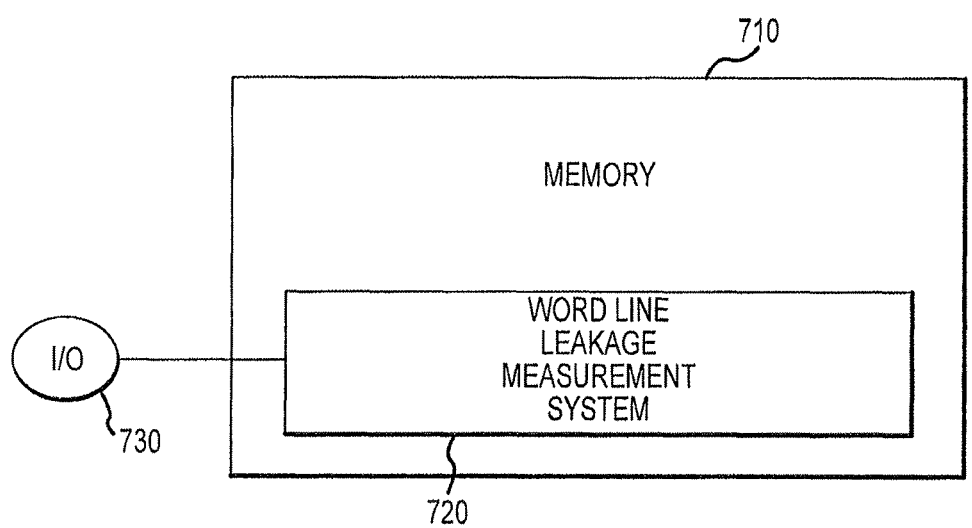
FIG. 7 is a block diagram of a memory with a word line leakage measurement system according to an embodiment of the invention.

FIG. 7 is a schematic illustration of a memory 710 including a word line leakage measurement system 720 in accordance with an embodiment of the present invention. The word line leakage measurement system 720 may include the word line leakage measurement system 200 of FIGS. 2 through 4, the word line leakage circuit 110 of FIG. 1, or the word line leakage circuit 610 of FIG. 6. The word line leakage measurement system 720 in memory 710 may be coupled to word lines (not shown) of the memory 710. The leakage measurement system 720 may charge one or more word lines to a high voltage and measure a leakage current from one or more word lines via one or more measurement nodes proportionally coupled to the word line(s) to determine if the leakage current (s) is (are) acceptable, as described above.

In one embodiment, the word line leakage measurement system 720 in the memory 710 may receive one or more external signals through one or more input/output nodes 730. Based on the decoding of this external signal or signals, the word line leakage measurement system 720 may select one or more of the word lines to be tested with a specified threshold voltage/current during a specified period of time. For example, the word line leakage measurement system 720 may initially test for a leakage current at a specified threshold over a specified period of time on a first word line. The word line leakage memory system 720 may then test other word lines for leakage current and/or test the first word line for a leakage current using a different threshold or over a different (e.g., shorter or longer) period of time. If during the one or more leakage current tests, the leakage current on one or more of the word lines of the memory 710 is determined to be, for example, unacceptable, the word line leakage measurement system 720 may output a signal indicating that the one or more word lines failed the leakage current test via the input/output node 730.

Accordingly, during a manufacturing process the memory 710 may receive one or more external signals through the one or more input/output nodes 730, and each of the one or more external signals may then initiate one or more word line leakage tests in the memory 710 using one or more thresholds over one or more lengths of time. At the end of each of the one or more leakage tests, the word line leakage measurement system 720 may generate a PASS/FAIL signal, as described above, which may be made available at and accessible externally through one or more input/output nodes 730, the signals indicating whether the individual word lines or the memory 710 as a whole has passed the one or more particular leakage test(s).

In another embodiment, the word line leakage measurement system 720 in the memory 710 may automatically run a series of leakage tests, which may be controlled for example, by a state machine (not shown), which may in some embodiments, be internal to the memory 710. Accordingly, when the series of leakage tests are completed, the word line leakage measurement system 720 may have measured the leakage current on each of the word lines of the memory 710. Furthermore, the result of each of the series of tests may be accessible externally through one or more input/output nodes 730. Therefore, by incorporating a built-in leakage measurement system, such as the word line leakage measurement system 720, in memory devices, the leakage current on the word lines of memory devices may be automatically measured without the use of an external leakage measurement instrument. Consequently, the manufacturing cycle and the overall product cost may be reduced in some examples.

Figure 8:
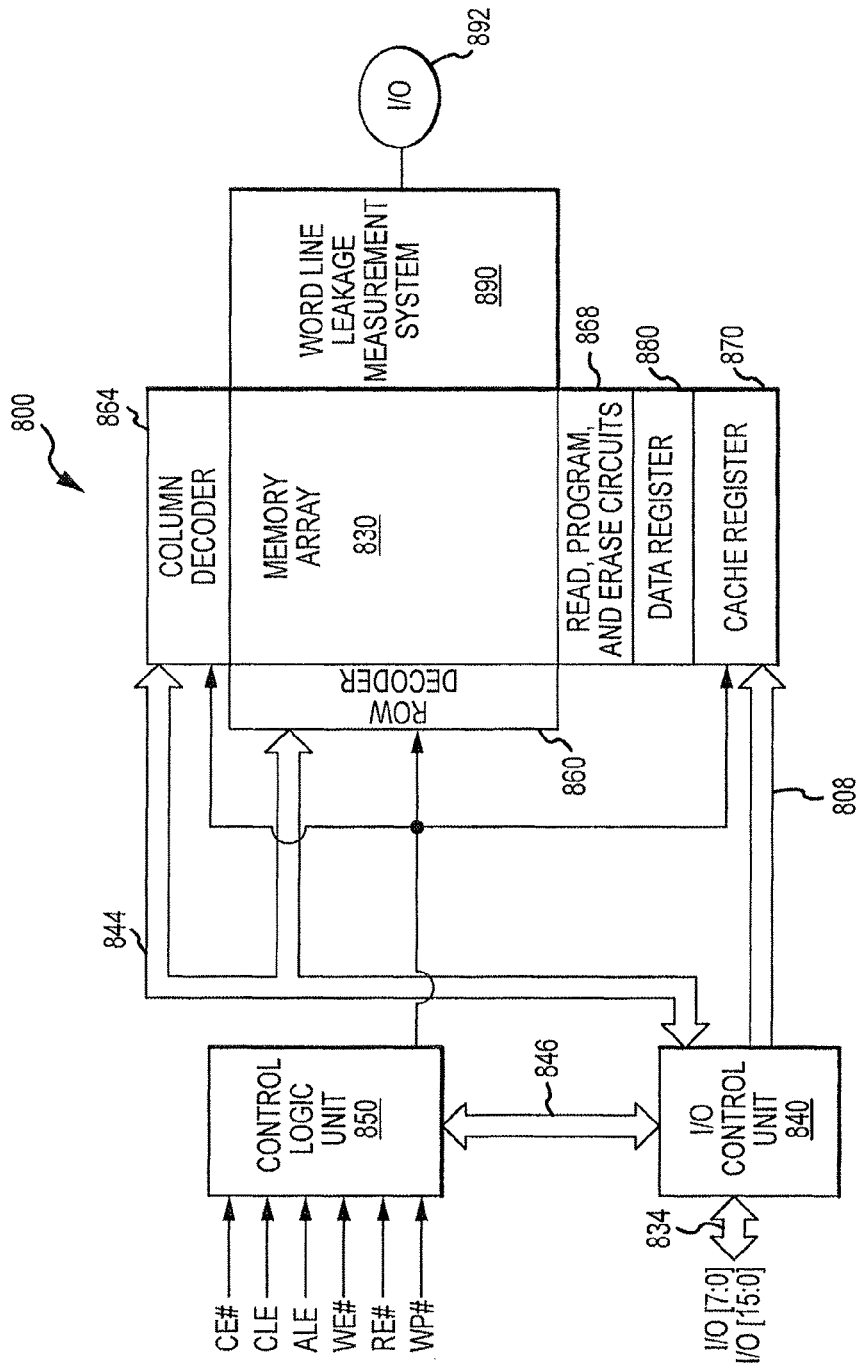
FIG. 8 is a block diagram of portions of a memory with a word line leakage measurement system according to an embodiment of the invention.

FIG. 8 illustrates portions of a memory 800 including a leakage measurement system according to an embodiment of the present invention. The memory 800 includes an array 830 of memory cells. The memory cells may be NAND flash memory cells, but may also be NOR flash, DRAM, SDRAM, or any other type of memory cells. Command signals, address signals and write data signals may be provided to the memory 800 as sets of sequential input/output ("I/O") signals transmitted through an I/O bus 834. Similarly, read data signals may be provided from the flash memory 800 through the I/O bus 834. The I/O bus is connected to an I/O control unit 840 that routes the signals between the I/O bus 834 and an internal data bus 808, an internal address bus 844, and an internal command bus 846. The memory 800 also includes a control logic unit 850 that receives a number of control signals either externally or through the command bus 846 to control the operation of the memory 800.

The address bus 844 applies block-row address signals to a row decoder 860 and column address signals to a column decoder 864. The row decoder 860 and column decoder 864 may be used to select blocks of memory or memory cells for memory operations, for example, read, program, and erase operations. The column decoder 864 enables write data signals to be applied to columns of memory corresponding to the column address signals and allow read data signals to be coupled from columns corresponding to the column address signals.

In response to the memory commands decoded by the control logic unit 850, the memory cells in the array 830 are read, programmed, or erased. Read, program, and erase circuits 868 coupled to the memory array 830 receive control signals from the control logic unit 850 and include voltage sources for generating various voltages for read, program and erase operations.

After the row address signals have been applied to the address bus 844, the I/O control unit 840 routes write data signals to a cache register 870. The write data signals are stored in the cache register 870 in successive sets each having a size corresponding to the width of the I/O bus 834. The cache register 870 sequentially stores the sets of write data signals for an entire page (e.g., an entire row or a portion of a row) of memory cells in the array 830. All of the stored write data signals are then used to program a page of memory cells in the array 830 selected by the block-row address coupled through the address bus 844. In a similar manner, during a read operation, data signals from a read page of memory cells selected by the block-row address coupled through the address bus 844 are stored in a data register 880. Sets of data signals corresponding in size to the width of the I/O bus 834 are then sequentially transferred through the I/O control unit 840 from the data register 880 to the I/O bus 834.

The memory 800 illustrated in FIG. 8 also includes a word line leakage measurement system 890. The word line leakage measurement system may include, for example, the word line leakage circuit 110 of FIG. 1, the leakage measurement system 200 of FIGS. 2 through 4, or the word line leakage circuit 610 of FIG. 6. The word line leakage measurement system 890 of the memory 800 may in some embodiments be coupled to one or more input/output nodes 892, as illustrated in FIG. 8. In other embodiments, however the word line leakage measurement system 890 may be coupled to input/output nodes via the I/O bus 834. The word line leakage circuits (not shown) of the word line leakage measurement system 890 may be coupled to the word lines of the memory array 830 in some embodiments. Furthermore, the voltage source or sources in the read, program, and erase circuits 868 may provide high voltages to the word line leakage circuits of the word line leakage measurement system 890 in some embodiments, although in other embodiments a different voltage source or sources may provide the high voltages to the word line leakage circuits.

From the foregoing it will be appreciated that, although specific embodiments of the invention have been described herein for purposes of illustration, various modifications may be made without deviating from the spirit and scope of the invention. For example, although FIG. 1 illustrates the proportioning circuit 120 as two capacitances 122, 124, the proportioning circuit may comprise circuit elements in addition to, or in place of the two capacitances 122, 124. Also, the word line leakage circuit 110 may include additional enable switches (not shown) and/or discharge or initialization circuits (not shown). A discharge circuit, for example, may ground a portion of a word line WL<X> 102 within the word line leakage circuit 110 when the word line leakage circuit is not in a test mode.

The various voltages in the embodiments described above may also vary. For example, a supply voltage (such as VCC), may be 2.3V in some instances, or may be 1.2V, 3.6V, 5V, etc. in other instances. Also, the high voltage used to charge one or more word lines, or the high voltage used to enable or disable the switches 112, 114 in FIG. 1 may vary and may be, for example, 8V, 10V, 15V, etc.

Furthermore, the memory illustrated in FIG. 8 may be implemented in any of a variety of products employing processors and/or memory including for example cameras, phones, wireless devices, displays, chip sets, set top boxes, gaming systems, vehicles, and appliances. Also, the invention is not limited to memories such as NAND flash, but rather is generally applicable to memory (including, for example, cache memory, DRAM, etc.) and other semiconductor devices. Accordingly, the invention is not limited except as by the appended claims.

What is claimed is:
1. A method, comprising:
comparing a voltage of a measurement node with a reference voltage to determine whether leakage of a word line exceeds a threshold;
compensating for noise encountered on the word line; and
providing a signal indicative of the comparison.

2. The method of claim 1, wherein the noise encountered on the word line is introduced by a switch transitioning from conductive to non-conductive.

3. The method of claim 2, wherein compensating for noise encountered on the word line comprises transitioning a compensation switch from non-conductive to conductive.

4. The method of claim 2, wherein compensating for noise further comprises compensating for a decrease in voltage due to the switch transition.

5. The method of claim 1, wherein the signal indicates failing a word line leakage test responsive to the leakage of the word line exceeding the threshold.

6. An apparatus, comprising:
a word line leakage measurement system coupled to word lines of a memory, the word line leakage measurement system including a comparator configured to compare a voltage of a measurement node to a reference voltage to test for leakage current, and further including a compensation circuit configured to compensate for noise from decoupling the measurement node from a supply voltage source;
wherein the word line leakage measurement system is configured to automatically runs series of leakage tests for the word lines of the memory.

7. The apparatus of claim 6, further comprising a state machine coupled to the word line leakage measurement system.

8. The apparatus of claim 7 wherein the state machine is configured to control the series of leakage tests.

9. The apparatus of claim 6, wherein the word line leakage measurement system is internal to the memory.

10. The apparatus of claim 9, further comprising one or more input/output nodes coupled to the word line leakage measurement system.

11. The apparatus of claim 10, wherein results of the series of leakage tests are accessible externally through the one or more input/output nodes.

12. The apparatus of claim 6, wherein the series of leakage tests indicate whether leakage of a word line of the memory exceeds a threshold.

13. The apparatus of claim 6 wherein the word line leakage measurement system further includes a capacitive voltage divider coupled to the measurement node.

14. The apparatus of claim 6 wherein the word line leakage measurement system further includes a proportioning circuit coupled to the measurement node.

15. The apparatus of claim 6 wherein the compensation circuit of the word line leakage measurement system comprises a switch.

16. A method comprising:
decoupling a word line charged to a first voltage from a first voltage source;
decoupling a measurement node charged to a second voltage from a supply voltage source;
compensating for noise on the word line caused by decoupling the measurement node;
comparing a voltage on the measurement node with a reference voltage; and
providing a signal having a value based on the comparison.

17. The method of claim 16, further comprising:
capacitively coupling the word line to the measurement node; and
capacitively coupling the measurement node to ground.

18. The method of claim 16, wherein decoupling the measurement node from the supply voltage comprises transitioning a switch from being conductive to being non-conductive and wherein compensating for noise on the word line caused by decoupling the measurement node comprises transitioning another switch coupled to the measurement node from being non-conductive to being conductive.

19. The method of claim 16, further comprising:
decoupling an adjacent word line at ground concurrently with decoupling the word line charged to the first voltage from the first voltage source.

20. The method of claim 16, further comprising:
decoupling other word lines, decoupling other measurement nodes, compensating for noise on the other word lines, comparing a respective voltage on the other measurement nodes with the reference voltage, and providing a respective signal having a value based on the respective comparison.

* * * * *